(12) United States Patent
Hauenstein

(10) Patent No.: US 8,804,340 B2
(45) Date of Patent: Aug. 12, 2014

(54) POWER SEMICONDUCTOR PACKAGE WITH DOUBLE-SIDED COOLING

(75) Inventor: Henning M. Hauenstein, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 13/155,804

(22) Filed: Jun. 8, 2011

(65) Prior Publication Data

US 2012/0314372 A1    Dec. 13, 2012

(51) Int. Cl.
    *H05K 7/20*    (2006.01)

(52) U.S. Cl.
    USPC ...... 361/715; 361/679.54; 361/699; 361/719; 361/743; 361/748; 257/675; 257/690; 257/713; 257/718; 257/735

(58) Field of Classification Search
    USPC ......... 361/679.46, 679.53, 679.54, 688, 689, 361/698–702, 707–714; 165/80.3–80.5, 165/104.19, 104.33, 104.34, 185; 174/15.1, 174/16.3, 252, 15.2, 255, 52.1; 62/259.2; 257/691, 696, 690, 701, 706–727, 687, 257/502, 341, 342, 778, E23.84; 29/592.1, 29/740, 741, 759, 602.1, 831, 832
    See application file for complete search history.

(56) References Cited

U.S. PATENT DOCUMENTS

| | | | | |
|---|---|---|---|---|
| 6,072,240 A * | 6/2000 | Kimura et al. | ................ | 257/735 |
| 6,377,461 B1 * | 4/2002 | Ozmat et al. | ................... | 361/704 |
| 6,442,033 B1 * | 8/2002 | Liu et al. | ....................... | 361/743 |
| 6,448,645 B1 * | 9/2002 | Kimura et al. | ................ | 257/735 |
| 6,693,350 B2 * | 2/2004 | Teshima et al. | ............... | 257/712 |
| 6,703,707 B1 * | 3/2004 | Mamitsu et al. | .............. | 257/718 |
| 6,798,062 B2 * | 9/2004 | Mamitsu et al. | .............. | 257/713 |
| 6,812,559 B2 * | 11/2004 | Palm et al. | ..................... | 257/691 |
| 6,845,012 B2 * | 1/2005 | Ohkouchi | ..................... | 361/704 |
| 6,960,825 B2 * | 11/2005 | Mamitsu et al. | .............. | 257/718 |
| 6,963,133 B2 * | 11/2005 | Teshima | ........................ | 257/718 |
| 6,967,404 B2 * | 11/2005 | Mamitsu et al. | .............. | 257/718 |
| 7,042,725 B2 * | 5/2006 | Martin et al. | .................. | 361/699 |
| 7,208,829 B2 * | 4/2007 | Hauenstein et al. | .......... | 257/690 |
| 7,236,368 B2 * | 6/2007 | Maxwell et al. | .............. | 361/719 |
| 7,456,492 B2 * | 11/2008 | Mochida | ....................... | 257/659 |
| 7,492,594 B2 * | 2/2009 | Pal | ................................. | 361/699 |
| 7,504,720 B2 * | 3/2009 | Nakatsu et al. | ............... | 257/712 |
| 7,508,668 B2 * | 3/2009 | Harada et al. | ................. | 361/699 |
| 7,542,291 B2 * | 6/2009 | Karrer et al. | ................... | 361/699 |

(Continued)

FOREIGN PATENT DOCUMENTS

| | | | | |
|---|---|---|---|---|
| DE | 102004018477 A1 * | 4/2004 | ............ | H01L 23/367 |
| EP | 2178117 A1 * | 4/2010 | ............ | H01L 23/367 |
| JP | 2001-308263 | 11/2001 | | |
| JP | 2003-31765 | 1/2003 | | |

*Primary Examiner* — Michail V Datskovskiy
(74) *Attorney, Agent, or Firm* — Farjami & Farjami LLP

(57) ABSTRACT

According to an exemplary embodiment, a power semiconductor package includes a power module having a plurality of power devices. Each of the plurality of power devices can be a power switch. The power semiconductor package also includes a double-sided heat sink with a top side in contact with a plurality of power device top surfaces and a bottom side in contact with a bottom surface of the power module. The power semiconductor package can include at least one fastening clamp pressing the top side and the bottom side of the double-sided heat sink into the power module. The double-sided heat sink can also include a water-cooling element.

20 Claims, 6 Drawing Sheets

(56) References Cited

U.S. PATENT DOCUMENTS

| | | | |
|---|---|---|---|
| 7,547,966 B2 * | 6/2009 | Funakoshi et al. | 257/707 |
| 7,554,188 B2 | 6/2009 | Hauenstein | |
| 7,619,302 B2 | 11/2009 | Hauenstein | |
| 7,642,640 B2 * | 1/2010 | Shinohara | 257/699 |
| 7,724,523 B2 * | 5/2010 | Ishiyama | 361/699 |
| 7,759,778 B2 * | 7/2010 | Lowry et al. | 257/675 |
| 7,816,786 B2 * | 10/2010 | Nakatsu et al. | 257/714 |
| 7,848,104 B2 * | 12/2010 | Shinohara | 361/695 |
| 7,957,135 B2 * | 6/2011 | Ohkouchi et al. | 361/679.54 |
| 7,965,508 B2 * | 6/2011 | Yamamoto et al. | 361/699 |
| 8,018,056 B2 * | 9/2011 | Hauenstein | 257/730 |
| 8,232,635 B2 * | 7/2012 | Zhuang | 257/701 |
| 8,279,605 B2 * | 10/2012 | Kawanami et al. | 361/704 |
| 8,450,845 B2 * | 5/2013 | Ikeda et al. | 257/712 |
| 2006/0120047 A1 * | 6/2006 | Inoue | 361/699 |
| 2006/0138452 A1 * | 6/2006 | Knapp et al. | 257/177 |
| 2007/0096278 A1 * | 5/2007 | Nakatsu et al. | 257/678 |
| 2007/0138651 A1 | 6/2007 | Hauenstein | |
| 2007/0216013 A1 * | 9/2007 | Funakoshi et al. | 257/691 |
| 2007/0273009 A1 | 11/2007 | Hauenstein | |
| 2007/0290311 A1 | 12/2007 | Hauenstein | |
| 2008/0012045 A1 | 1/2008 | Muto | |
| 2008/0093730 A1 * | 4/2008 | Furuta | 257/712 |
| 2008/0224303 A1 * | 9/2008 | Funakoshi et al. | 257/701 |
| 2009/0116197 A1 * | 5/2009 | Funakoshi et al. | 361/719 |
| 2009/0160048 A1 * | 6/2009 | Nakatsu et al. | 257/714 |
| 2009/0194862 A1 * | 8/2009 | Kitami | 257/690 |
| 2010/0065950 A1 * | 3/2010 | Lowry et al. | 257/675 |
| 2010/0230800 A1 * | 9/2010 | Beaupre et al. | 257/691 |
| 2011/0089558 A1 * | 4/2011 | Muto et al. | 257/712 |
| 2011/0241198 A1 * | 10/2011 | Azuma | 257/696 |
| 2011/0316086 A1 * | 12/2011 | Hauenstein | 257/368 |
| 2012/0001316 A1 * | 1/2012 | Hauenstein | 257/690 |
| 2012/0300522 A1 * | 11/2012 | Tokuyama et al. | 363/131 |
| 2013/0140684 A1 * | 6/2013 | Hauenstein | 257/659 |

* cited by examiner

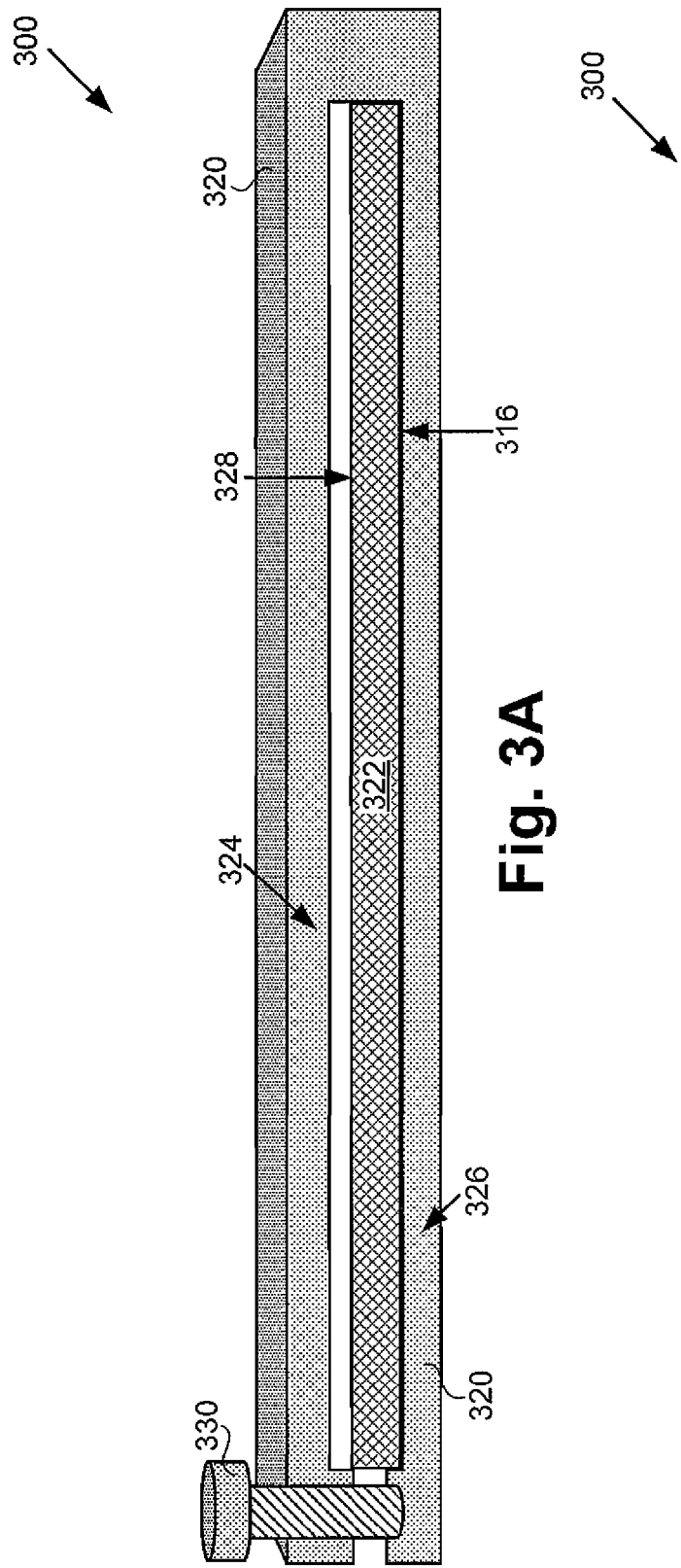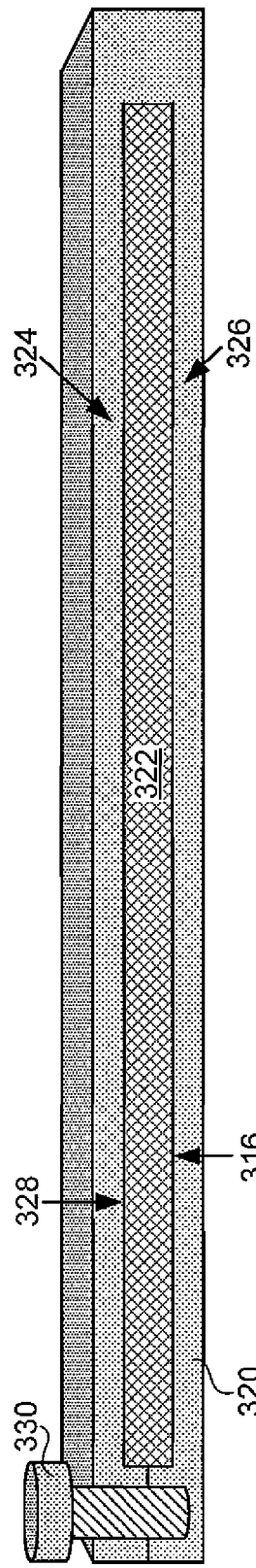

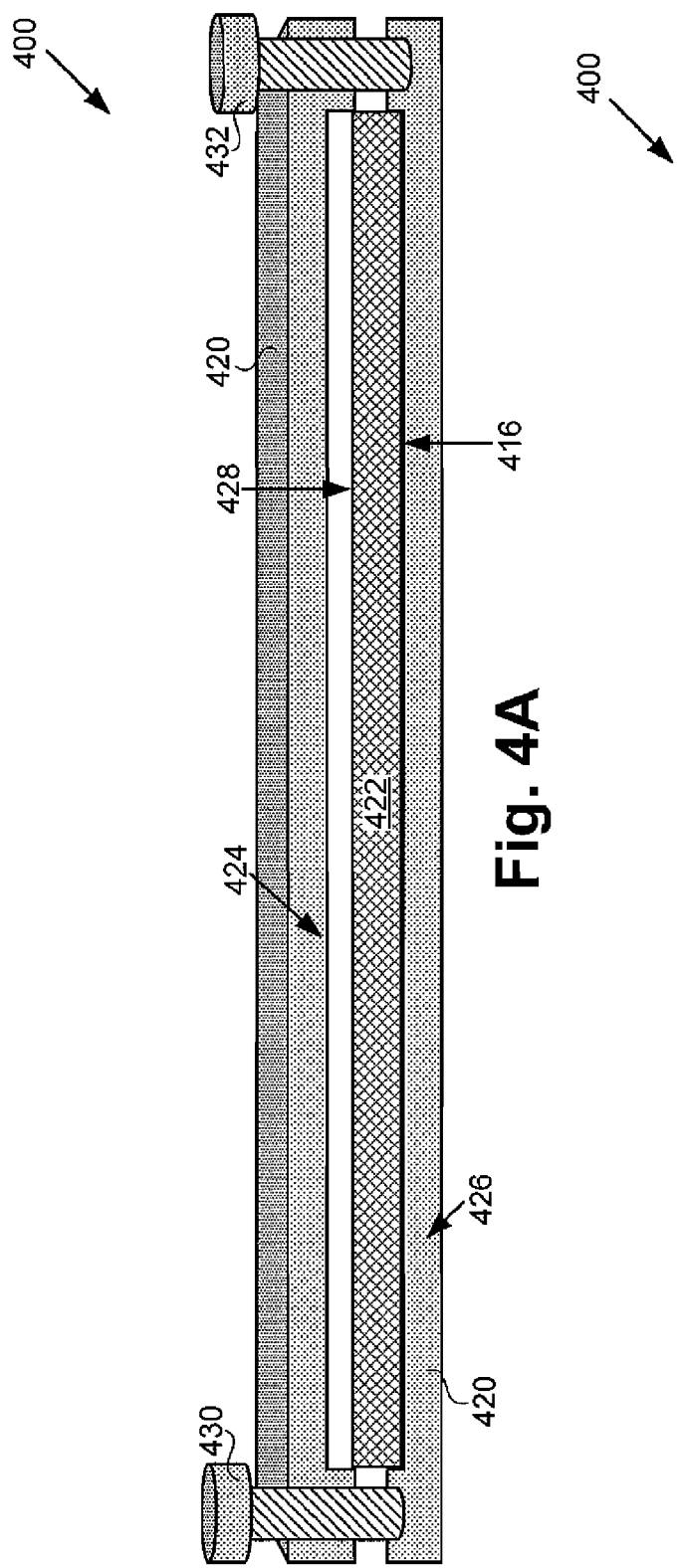
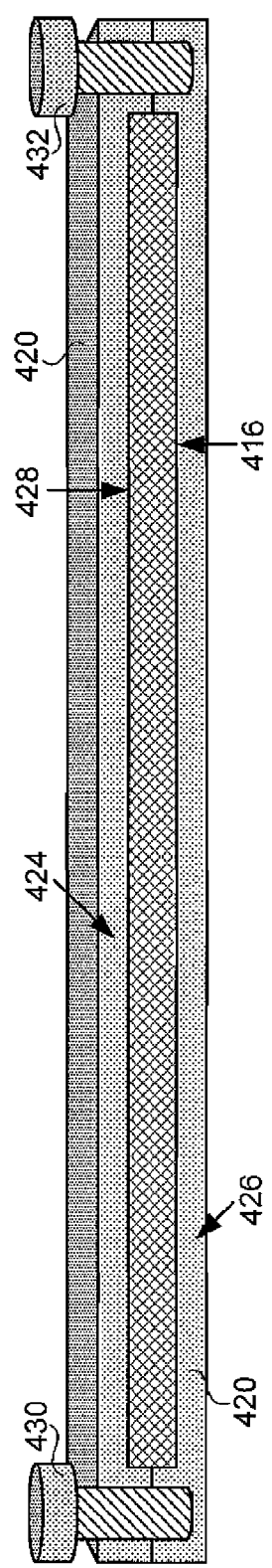

POWER SEMICONDUCTOR PACKAGE WITH DOUBLE-SIDED COOLING

BACKGROUND OF THE INVENTION

1. Field of the Invention

The present invention is generally in the field of semiconductors. More particularly, the invention is in the field of packaging of semiconductors.

2. Background Art

A power module having power devices can be used in high voltage and high current applications. For example, the power module may be a motor drive inverter module with the power devices being power switches. In order for the power devices to perform properly, their temperature must be held within a suitable temperature range. However, the power devices typically generate significant heat, which can cause their temperature to rise outside of the suitable temperature range if the heat is not sufficiently dissipated from the power devices. Thus, the power module, and any packaging which may include the power module, should be constructed so as to effectively cool the power devices.

One approach to cooling the power devices may involve utilizing a heat sink thermally coupled to the power devices to assist in dissipating the heat from the power devices. As an example, each of the power devices can be incorporated as one or more dies in the power module. The power module conventionally includes bond wires connecting the dies to conductive traces on a substrate of the power module. The heat sink can be attached to the substrate and can be thermally coupled to the power devices through the substrate. However, using this approach, it can be difficult for the heat sink to sufficiently dissipate heat from the power devices. Furthermore, the heat sink must often be large and expensive to sufficiently cool the power devices thereby increasing manufacturing cost and reducing design flexibility of packaging for the power module.

Thus, there is a need in the art to provide sufficient cooling for a power module having power devices while overcoming the drawbacks and deficiencies in the art.

SUMMARY OF THE INVENTION

A power semiconductor package with double-sided cooling, substantially as shown in and/or described in connection with at least one of the figures, and as set forth more completely in the claims.

BRIEF DESCRIPTION OF THE DRAWINGS

FIG. 3A shows a perspective view of a power semiconductor package with a double-sided heat sink and a fastening clamp, in accordance with an embodiment of the present invention.

FIG. 3B shows a perspective view of a power semiconductor package with a double-sided heat sink and a fastening clamp, in accordance with an embodiment of the present invention.

FIG. 4A shows a perspective view of a power semiconductor package with a double-sided heat sink and fastening clamps, in accordance with an embodiment of the present invention.

FIG. 4B shows a perspective view of a power semiconductor package with a double-sided heat sink and fastening clamps, in accordance with an embodiment of the present invention.

DETAILED DESCRIPTION OF THE INVENTION

The present invention is directed to a power semiconductor package with double-sided cooling. The following description contains specific information pertaining to the implementation of the present invention. One skilled in the art will recognize that the present invention may be implemented in a manner different from that specifically discussed in the present application. Moreover, some of the specific details of the invention are not discussed in order to not obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

Figure 1:
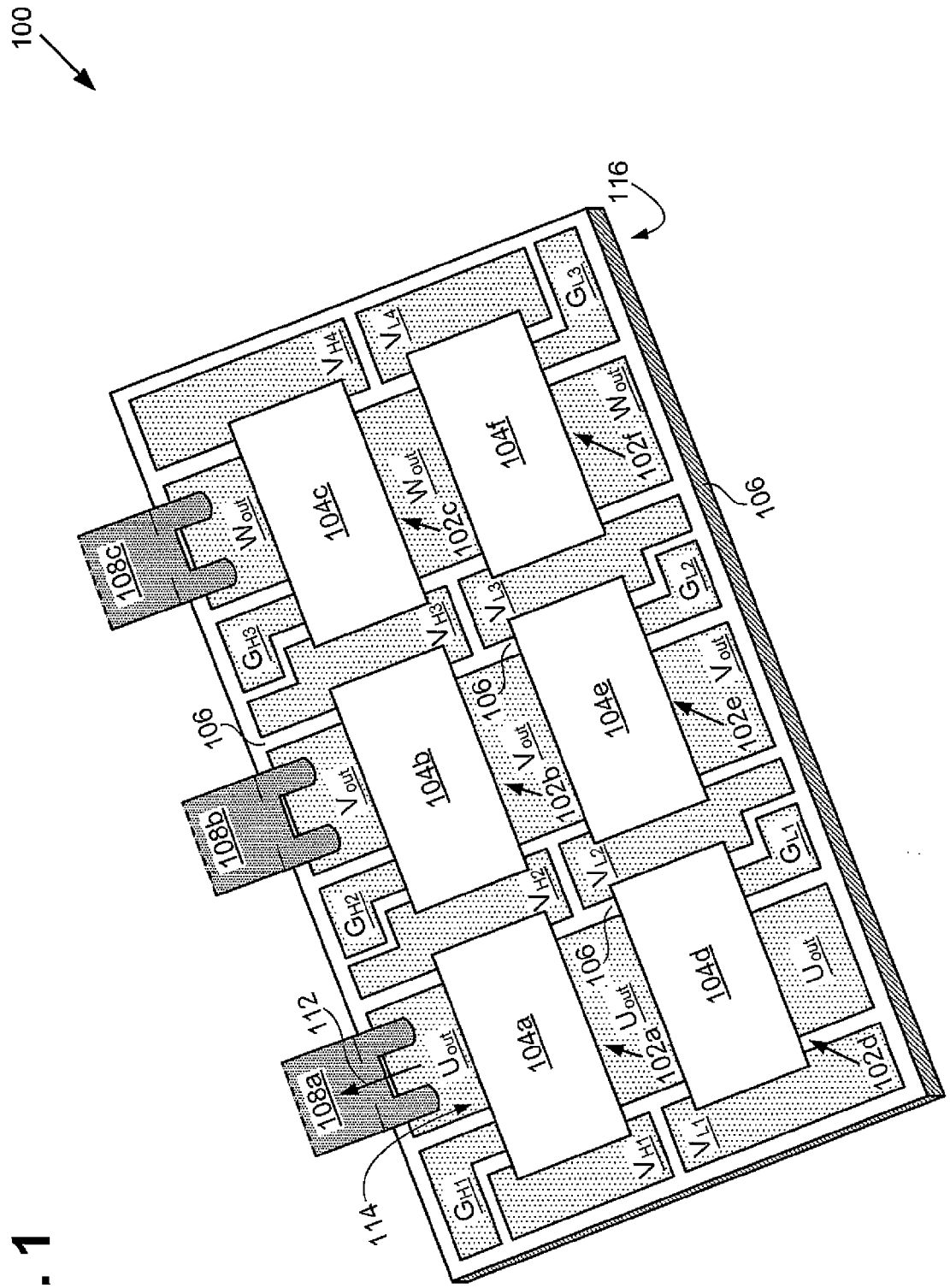
FIG. 1 shows a perspective view of a power module, in accordance with an embodiment of the present invention.

FIG. 1 shows a perspective view of power module 100 (which may also be referred to herein as "three-phase inverter module" and "motor drive inverter module" or the like), in accordance with an embodiment of the present invention. In the present embodiment, power module 100 is a polyphase inverter module and more particularly, a three-phase inverter module.

Power module 100 comprises high side devices 102a, 102b, 102c (also referred to herein as "power devices 102," "plurality of power devices 102" and "high side devices 102") and low side devices 102d, 102e, and 102f (also referred to herein as "power devices 102," "plurality of power devices 102" and "low side devices 102"), high side conductive clips 104a, 104b, 104c (also referred to herein as "conductive clips 104" and "high side conductive clips 104") and low side conductive clips 104d, 104e, and 104f (also referred to herein as "conductive clips 104" and "low side conductive clips 104"), high side gate pads $G_{H1}$, $G_{H2}$, $G_{H3}$ (also referred to herein as "gate pads G" and "high side gate pads G") and low side gate pads $G_{L1}$, $G_{L2}$, and $G_{L3}$ (also referred to herein as "gate pads G" and "low side gate pads G"), high side power pads $V_{H1}$, $V_{H2}$, $V_{H3}$, $V_{H4}$ (also referred to herein as "power pads V" and "high side power pads V") and low side power pads $V_{L1}$, $V_{L2}$, $V_{L3}$, and $V_{L4}$ (also referred to herein as "power pads V" and "low side power pads V") and output current pads $U_{out}$, $V_{out}$, and $W_{out}$.

FIG. 1 shows power devices 102 on substrate 106. Substrate 106 can comprise for example, ceramic, or other substrate materials. Power pads V, gate pads G, and common output pads $U_{out}$, $V_{out}$, and $W_{out}$ each comprise conductive material, such as copper. In the present embodiment power pads V, gate pads G, and common output pads $U_{out}$, $V_{out}$ and $W_{out}$ comprise direct bonded copper (DBC) of substrate 106, which can be a DBC substrate.

As described above, in the present embodiment, power module 100 is a three-phase inverter module, which can be used to, for example, control a motor (not shown in FIG. 1). A U phase of power module 100 includes power devices 102*a* and 102*d* connected in a half-bridge with output current pad $U_{out}$ connected between power devices 102*a* and 102*d*. Similarly, a V phase of power module 100 includes power devices 102*b* and 102*e* connected in a half-bridge with output current pad $V_{out}$ connected between power devices 102*b* and 102*e*. Also, a W phase of power module 100 includes power devices 102*c* and 102*f* connected in a half-bridge with output current pad $W_{out}$ connected between power devices 102*c* and 102*f*. Thus, output current pads $U_{out}$, $V_{out}$, and $W_{out}$ can serve as phase outputs of power module 100. It is noted that output current pads $U_{out}$, $V_{out}$, and $W_{out}$ are each a single continuous pad in the present embodiment.

In the present embodiment, power devices 102 are power switches of power module 100. Each of power devices 102 includes a respective freewheeling diode connected in parallel with a respective insulated-gate bipolar transistor (IGBT) (not shown in FIG. 1). In some embodiments, power devices 102 may not include the freewheeling diode or may include electrical components other than a freewheeling diode. In some embodiments, each of power devices 102 can include a metal-oxide-semiconductor field-effect transistor (MOSFET) instead of the freewheeling diode in parallel with the IGBT. Furthermore, although power devices 102 are power switches in the present embodiment, in other embodiments power devices 102 are other types of power devices.

FIG. 1 shows plurality of power devices 102 having corresponding plurality of power device top surfaces. In the present embodiment, each of the corresponding plurality of power device top surfaces comprises a top surface of one of conductive clips 104 (shown in FIG. 1) and is configured to carry current. Conductive clips 104 comprise metal, such as copper, metal alloy, or other conductive material and are over respective gate pads G, power pads V, and output current pads $U_{out}$, $V_{out}$, and $W_{out}$. Conductive clips 104 include the top surface (shown in FIG. 1) and opposing legs (not shown in FIG. 1) connected to the top surface. One of the opposing legs is electrically connecting the top surface to one of power pads V and the other of the opposing legs is electrically connecting the top surface to another of power pads V. For example, the opposing legs of conductive clip 104*a* are respectively electrically connected to high side power pads $V_{H1}$ and $V_{H2}$ in regions where conductive clip 104*a* overlaps power pads $V_{H1}$ and $V_{H2}$ in FIG. 1. In some embodiments a cap layer (not shown in FIG. 1) can be included over at least one conductive clip 104 of a power device 102. The cap layer can comprise substrate material similar to substrate 106.

It is noted that in the present embodiment conductive clips 104 are not electrically connected to output current pads $U_{out}$, $T_{out}$, and $W_{out}$ and gate pads G. Rather, for example, high side conductive clips 104 and high side power pads V form a current path between high side power pads $V_{H1}$ and $V_{H4}$ such that current can traverse through high side conductive clips 104 over output current pads $U_{out}$, $T_{out}$, and $W_{out}$ and high side gate pads G. As such, a high side power bus is formed between power pads $V_{H1}$ and $V_{H4}$ and any of positive, negative, or ground voltages can be connected to power pads $V_{H1}$ and $V_{H4}$ as inputs for power module 100. Similarly, low side conductive clips 104 and low side power pads V form a current path between low side power pads $V_{L1}$ and $V_{L4}$ such that current can traverse through low side conductive clips 104 over output current pads $U_{out}$, $V_{out}$, and $W_{out}$ and low side gate pads G. As such, a low side power bus is formed between power pads $V_{L1}$ and $V_{L4}$ and any of positive, negative, or ground voltages can be connected to power pads $V_{L1}$ and $V_{L4}$ as inputs for power module 100.

In power module 100, gate pads G are each control inputs, which can be used to selectively enable or disable a respective power device 102. More particularly gate pads $G_{H1}$, $G_{H2}$, $G_{H3}$, $G_{L1}$, $G_{L2}$, and $G_{L3}$ can be used to selectively enable or disable high side devices 102*a*, 102*b*, 102*c* and low side devices 102*d*, 102*e*, and 102*f* respectively. In the present embodiment, each of gate pads G are electrically connected to a gate of a corresponding IGBT in one of power devices 102 under a corresponding conductive clip 104 and can thereby selectively enable or disable the corresponding IGBT.

Thus, as described above, power module 100 comprises power pads V and gate pads G as inputs and output current pads $U_{out}$, $V_{out}$, and $W_{out}$ as outputs. Thus, power module 100 may include contacts connected to any of power pads V, gate pads G, and output current pads $U_{out}$, $V_{out}$, and $W_{out}$ to allow for connection of power module 100 to external circuits (not show in FIG. 1). FIG. 1 shows contacts 108*a*, 108*b*, and 108*c* (also referred to herein as "contacts 108"), which are press-fit clamps in the present embodiment. Contacts 108 illustrate one exemplary approach to providing contacts for connecting power module 100 to external circuits. It will be appreciated that numerous other approaches are possible with respect to various embodiments of the present invention.

Contacts 108 are engaging bottom surface 116 of substrate 106 with a prong (not shown in FIG. 1). In some embodiments bottom surface 116 of substrate 106 can comprise dielectric material and in other embodiments bottom surface 116 can comprise conductive material. Contacts 108 are further engaging a top side of respective output current pads $U_{out}$, $V_{out}$, and $W_{out}$ with two prongs, which can provide output current from power module 100. For example, contact 108*a* is engaging top side 114 of output current pad $U_{out}$ and can provide output current 112 from power module 100, which is a high current received by contact 108*a*. While FIG. 1 shows contacts 108, any combination of gate pads G, power pads V, and output current pads $U_{out}$, $V_{out}$, and $W_{out}$ can include one or more contacts similar to or different than contacts 108.

Thus, in the present embodiment, power module 100 comprises a three-phase inverter having power devices 102, which comprise power switches of three-phase inverter module 100. Three-phase inverter module 100 can be used in high voltage and high current applications. For example, in one embodiment, three-phase inverter module 100 can drive a motor of a hybrid vehicle. In order for power devices 102 to perform properly, their temperature must be held within a suitable temperature range. However, power devices 102 generate significant heat, which can cause their temperature to rise outside of the suitable temperature range if the heat is not sufficiently dissipated therefrom.

One approach to cooling power devices 102 may include utilizing a heat sink thermally coupled to power devices 102 through only bottom surface 116 of substrate 106 to assist in dissipating heat from power devices 102. However, using this approach, it can be difficult for the heat sink to sufficiently dissipate heat from power devices 102. Furthermore, the heat sink must be large and expensive to sufficiently cool power devices 102, thereby increasing manufacturing cost and reducing design flexibility of packaging for power module 100.

In accordance with various embodiments, the present invention provides for a power semiconductor package with a double-sided heat sink that allows for effective cooling of power devices 102 while further allowing for the aforementioned problems to be overcome. In some embodiments the heat sink includes a water-cooling element and in other embodiments, the heat sink can rely upon airflow cooling. Embodiments of the present invention provide high flexibility in the design of the power semiconductor package. As such, the design of power module 100 can be relatively standardized while the heat sink can be modified based on application specific requirements, thereby reducing design and manufacturing costs.

Figure 2:
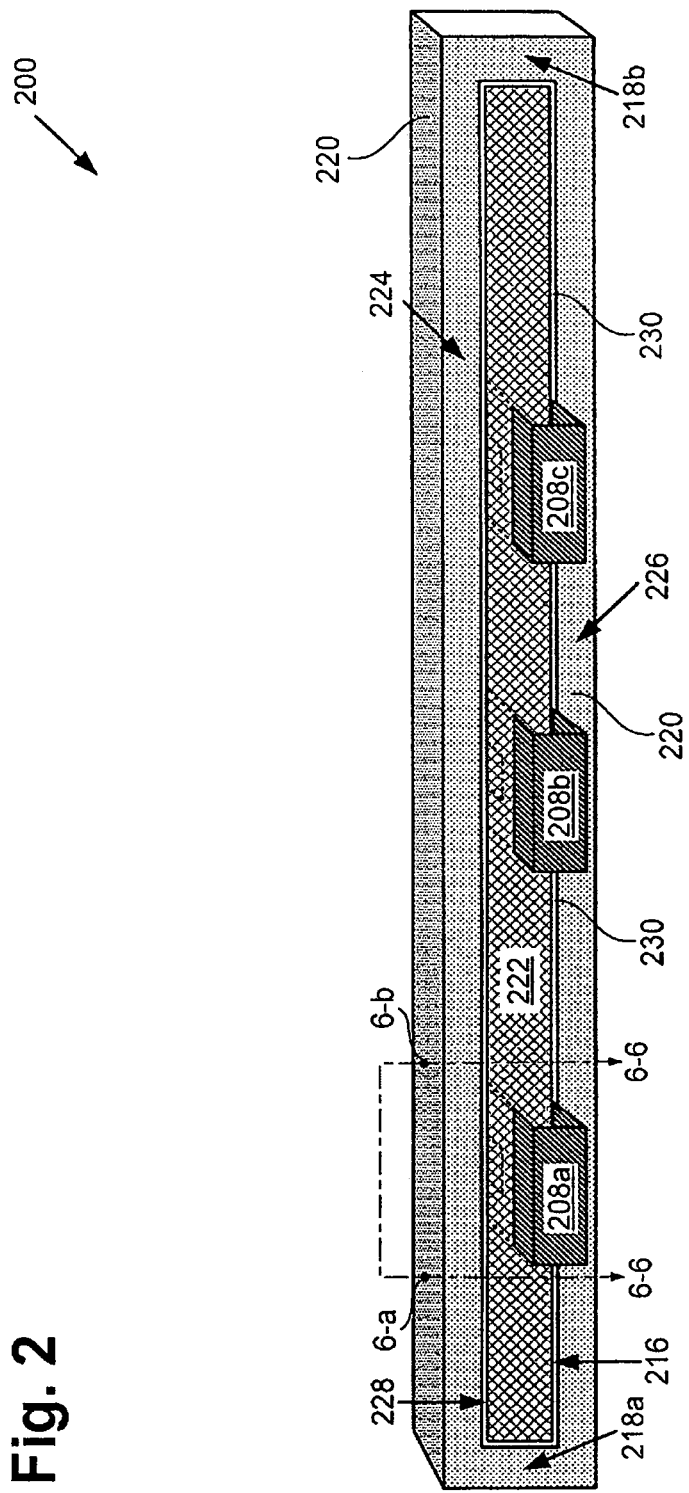
FIG. 2 shows a perspective view of a power semiconductor package with a double-sided heat sink, in accordance with an embodiment of the present invention.

Referring to FIG. 2, FIG. 2 shows a perspective view of power semiconductor package 200 with double-sided heat sink 220 (also referred to herein as "heat sink 220"), in accordance with an embodiment of the present invention. FIG. 2 also shows power module 222 corresponding to power module 100 in FIG. 1 and contacts 208a, 208b, and 208c (also referred to as "contacts 208") corresponding to contacts 108 in FIG. 1.

Heat sink 220 has top side 224, bottom side 226 and connecting portions 218a and 218b. Top side 224 is over power module 222 and bottom side 226 is under power module 222. Connecting portions 218a and 218b are joining top side 224 and bottom side 226 of heat sink 220. Thus, in the present embodiment, heat sink 220 encompasses and encloses power module 222. Heat sink 220 can comprise any suitable heat sink material such as a metal, a metal alloy, a metal oxide, a metal nitride, a ceramic, an organic material, and combinations thereof.

Double-sided heat sink 220 has top side 224 in contact with plurality of power device top surfaces 228 of power module 222, which correspond to the plurality of power device top surfaces of power devices 102 discussed above with respect to FIG. 1. Double-sided heat sink 220 also has bottom side 226 in contact with bottom surface 216 of power module 222, which can correspond to bottom surface 116 of substrate 106 in FIG. 1. Top side 224 of heat sink 220 is thermally coupled to plurality of power device top surfaces 228. Also, in the present embodiment, bottom side 226 is thermally coupled to bottom surface 216. Thus, heat sink 220 can advantageously dissipate heat from power module 222 through both plurality of power device top surfaces 228 and through bottom surface 216. Furthermore, heat sink 220 encompasses and encloses power module 222, thereby reducing the overall footprint of power semiconductor package 200. Thus, heat sink 220 can be smaller and less expensive than other heat sinks while providing effective cooling of power devices in power module 222. Furthermore, the particular design of heat sink 220 is highly flexible. For example, in various embodiments, heat sink 220 can comprise any combination of a fastening clamp pressing top side 224 and bottom side 226 of double-sided heat sink 220 into power module 222, a water-cooling element, and heat sink fins.

In the present embodiment, power semiconductor package 200 includes thermal coupling material 230 between plurality of power device top surfaces 228 and top side 224 and between bottom surface 216 and bottom side 226. Thermal coupling material 230 is thermally coupling plurality of power device top surfaces 228 with top side 224 and bottom surface 216 with bottom side 226. Thermal coupling material 230 can comprise, for example, one or more thermally conductive pads and/or thermal paste. In some embodiments, top side 224 of heat sink 220 can be thermally coupled to plurality of power device top surfaces 228 and bottom side 226 of heat sink 220 can be thermally coupled to bottom surface 216 without thermal coupling material 230.

Also, in the present embodiment, contacts 208 extend out from bottom side 226 of double-sided heat sink 220. Contacts 208 extend out from double-sided heat sink 220 to provide electrical contact to power module 222 by one or more external circuits (not shown in FIG. 2). It will be appreciated that numerous means can be utilized instead of or in addition to contacts 208 to provide electrical contact to power module 222 and the one or more external circuits.

In some embodiments heat sink 220 is applying a clamping force to power module 222. More particularly, top side 224 and bottom side 226 are preferably applying a clamping force on plurality of power device top surfaces 228 of power module 222. As described above, in some embodiments, power semiconductor package 200 can include at least one fastening clamp pressing top side 224 and bottom side 226 of double-sided heat sink 220 into power module 222 to apply the clamping force. In some embodiments the at least one fastening clamp can be at least one heat sink screw.

Turning to FIGS. 3A and 3B, FIGS. 3A and 3B show a perspective view of power semiconductor package 300 with double-sided heat sink 320 and fastening clamp 330, in accordance with an embodiment of the present invention. In FIGS. 3A and 3B, power semiconductor package 300 corresponds to power semiconductor package 200 in FIG. 2. Power semiconductor package 300 includes heat sink 320 corresponding to heat sink 220 in FIG. 2. For example, heat sink 320 includes top side 324 and bottom side 326 corresponding respectively to top side 224 and bottom side 226 in FIG. 2. Power module 322 corresponds to power module 222 in FIG. 2. For example, power module 322 includes plurality of power device top surfaces 328 and bottom surface 316 corresponding respectively to plurality of power device top surfaces 228 and bottom surface 216 in FIG. 2. Power semiconductor package 300 can also include other elements corresponding to elements of power semiconductor package 200 not specifically shown or described with respect to FIG. 3, such as contacts 208 and thermal coupling material 230. It is noted FIGS. 3A and 3B are illustrative and that portions of fastening clamp 330 that are within top side 324 and bottom side 326 are shown in FIGS. 3A and 3B for clarity.

Fastening clamp 330 is configured to press top side 324 and bottom side 326 of double-sided heat sink 320 into power module 322 and more particularly into plurality of power device top surfaces 328 and bottom surface 316 of power module 322. In the present embodiment, fastening clamp 330 comprises a heat sink screw configured to press top side 324 and bottom side 326 of double-sided heat sink 320 into power module 322. In other embodiments fastening clamp 330 can be an element other than a heat sink screw. Fastening clamp 330 extends through top side 324 and is received within bottom side 326. FIG. 3A shows fastening clamp 330 prior to pressing top side 324 and bottom side 326 of double-sided heat sink 320 into power module 322. FIG. 3B shows fastening clamp 330 pressing top side 324 and bottom side 326 of double-sided heat sink 320 into power module 322, which can be achieved by securing fastening clamp 330 into bottom side 326 of heat sink 320.

Thus, as described above, power semiconductor package 300 comprises fastening clamp 330 configured to press top side 324 and bottom side 326 of double-sided heat sink 320 into power module 322. As such, heat sink 320 can provide additional mechanical stability and ruggedness to power module 322, which can, for example, increase the ability of power module 322 to withstand temperature cycles. In some embodiments top side 324 can be separate from bottom side 326. Furthermore, the separate top side 324 and bottom side 326 can be attached to one another by at least one fastening clamp, such as fastening clamp 330.

Referring to FIGS. 4A and 4B, FIGS. 4A and 4B show a perspective view of power semiconductor package 400 with double-sided heat sink 420 and fastening clamps 430 and 432, in accordance with an embodiment of the present invention.

In FIGS. 4A and 4B, power semiconductor package 400 corresponds to power semiconductor package 300 in FIGS. 3A and 3B. Power semiconductor package 400 includes heat sink 420 corresponding to heat sink 320 in FIGS. 3A and 3B. For example, heat sink 420 includes top side 424 and bottom side 426 corresponding respectively to top side 324 and bottom side 326 in FIGS. 3A and 3B. Power module 422 corresponds to power module 322 in FIGS. 3A and 3B. For example, power module 422 includes plurality of power device top surfaces 428 and bottom surface 416 corresponding respectively to plurality of power device top surfaces 328 and bottom surface 316 in FIGS. 3A and 3B. It is noted FIGS. 4A and 4B are illustrative and that portions of fastening clamps 430 and 432 that are within top side 424 and bottom side 426 are shown in FIGS. 4A and 4B for clarity.

Fastening clamps 430 and 432 are configured to press top side 424 and bottom side 426 of double-sided heat sink 420 into power module 422 and more particularly into plurality of power device top surfaces 428 and bottom surface 416 of power module 422.

In the present embodiment, fastening clamps 430 and 432 comprise heat sink screws configured to press top side 424 and bottom side 426 of double-sided heat sink 420 into power module 422. In other embodiments, fastening clamps 430 and 432 can be elements other than heat sink screws. Fastening clamps 430 and 432 extend through top side 424 and are received by bottom side 426. FIG. 4A shows fastening clamps 430 and 432 prior to pressing top side 424 and bottom side 426 of double-sided heat sink 420 into power module 422. FIG. 4B shows fastening clamps 430 and 432 pressing top side 424 and bottom side 426 of double-sided heat sink 420 into power module 422, which can be achieved by securing fastening clamps 430 and 432 into bottom side 426 of heat sink 420.

Also shown in FIGS. 4A and 4B, top side 424 is separate from bottom side 426. Top side 424 and bottom side 426 of heat sink 420 can be attached to one another by at least one fastening clamp, such as fastening clamps 430 and 432. FIG. 4A shows top side 424 and bottom side 426 of heat sink 420 prior to being attached to one another by fastening clamps 430 and 432. FIG. 4A shows top side 424 and bottom side 426 of heat sink 420 attached to one another by fastening clamps 430 and 432. The embodiment shown in FIGS. 4A and 4B allows for additional flexibility in the design and assembly of power semiconductor package 400. In addition to any of the elements described above, a power semiconductor package in accordance with embodiments of the present invention can include at least one water-cooling element to assist in establishing the cooling capability of the power semiconductor package.

Figure 5:
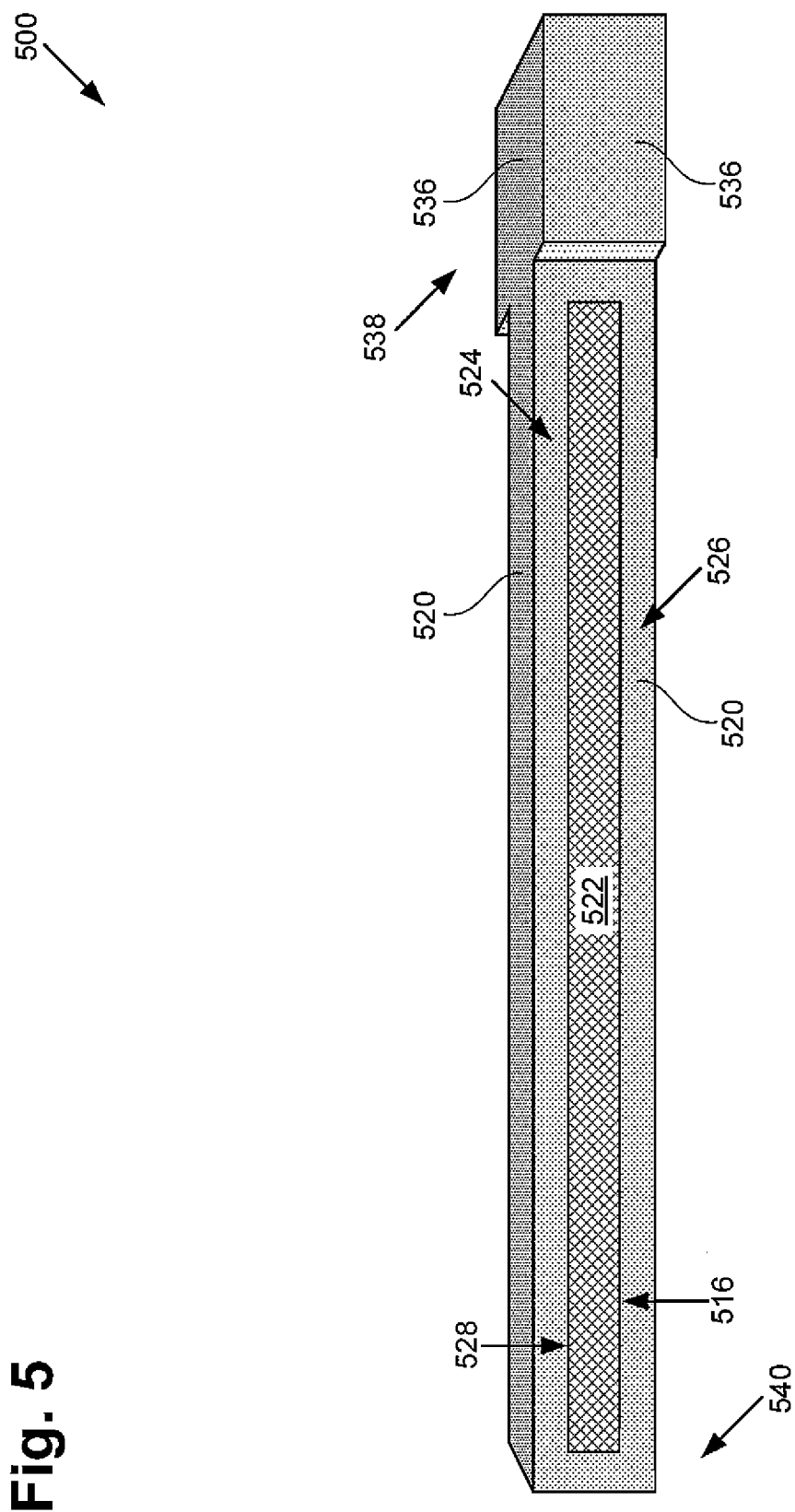
FIG. 5 shows a perspective view of a power semiconductor package with a double-sided heat sink and a water-cooling element, in accordance with an embodiment of the present invention.

Referring now to FIG. 5, FIG. 5 shows a perspective view of power semiconductor package 500 with double-sided heat sink 520 and water-cooling element 536, in accordance with an embodiment of the present invention. In FIG. 5, power semiconductor package 500 corresponds to power semiconductor package 200 in FIG. 2. Power semiconductor package 500 includes heat sink 520 corresponding to heat sink 220 in FIG. 2. For example, heat sink 520 includes top side 524 and bottom side 526 corresponding respectively to top side 224 and bottom side 226 in FIG. 2. Power module 522 corresponds to power module 222 in FIG. 2. For example, power module 522 includes plurality of power device top surfaces 528 and bottom surface 516 corresponding respectively to power device top surfaces 228 and bottom surface 216 in FIG. 2. Power semiconductor package 500 can also include other elements corresponding to power semiconductor package 200 not specifically shown or described with respect to FIG. 5, such as contacts 208 and thermal coupling material 230.

Water-cooling element 536 can assist in enhancing the cooling capability of power semiconductor package 500 by utilizing water to dissipate heat from power module 522, and more particularly from power devices in power module 522. For example, in various embodiments water can circulate through any portion of double-sided heat sink 520 to dissipate heat from power module 522. In the present embodiment double-sided heat sink 520 includes water-cooling element 536 coupling top side 524 and bottom side 526 of double-sided heat sink 520. Water-cooling element 536 is shown as being on side 538 of heat sink 520, however, water-cooling element 536 can be placed elsewhere in addition to or instead of on side 538, such as on side 540. Water-cooling element 536 can also be placed over and/or under power module 522. Water-cooling element 536 can advantageously enhance the cooling capability of power module 522 in applications requiring additional cooling of power module 522 without requiring significant modification to the design of power module 522. It will be appreciated that the various elements described above with respect to FIGS. 2, 3A, 3B, 4A, 4B, and 5 can be combined and are not limited to the specific embodiments shown. As one example, power semiconductor package 500 can include fastening clamps similar to fastening clamps 430 and 432 in FIGS. 4A and 4B.

Figure 6:
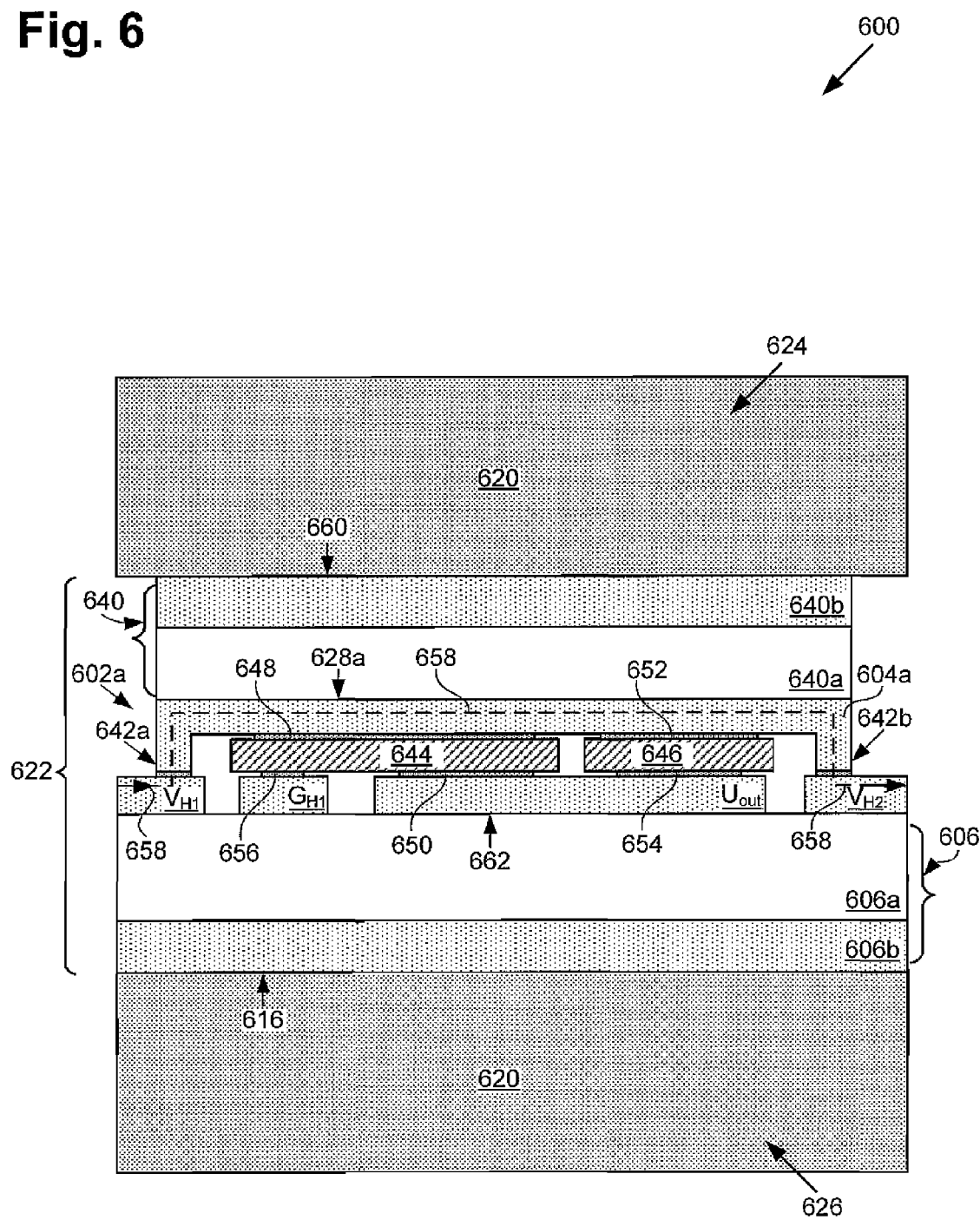
FIG. 6 shows a cross-sectional view of a power semiconductor package with a double-sided heat sink, in accordance with an embodiment of the present invention.

FIG. 6 shows a cross-sectional view of power semiconductor package 600 with double-sided heat sink 620, in accordance with an embodiment of the present invention. More particularly, FIG. 6 shows a cross-sectional view corresponding to cross-section 6-6 in FIG. 2. In FIG. 2 cross-section 6-6 enters power semiconductor package 200 at points 6-$a$ and 6-$b$ of top side 224 of heat sink 220 and exits power semiconductor package 200 through bottom side 226 of heat sink 220. FIG. 6 can also correspond to a similar cross-section of any of power semiconductor packages 300, 400, and 500.

In FIG. 6, power semiconductor package 600 corresponds to power semiconductor package 200 in FIG. 2. Power semiconductor package 600 includes heat sink 620 corresponding to heat sink 220 in FIG. 2. For example, heat sink 620 includes top side 624 and bottom side 626 corresponding respectively to top side 224 and bottom side 226 in FIG. 2. Power module 622 corresponds to power module 222 in FIG. 2. For example, power module 622 includes power device top surface 628$a$ and bottom surface 616 corresponding respectively to one of plurality of power device top surfaces 228 and bottom surface 216 in FIG. 2. Power semiconductor package 600 can also include other elements corresponding to power semiconductor package 200 not specifically shown or described with respect to FIG. 6, such as contacts 208 and thermal coupling material 230.

Also in FIG. 6, power module 622 corresponds to power module 100 in FIG. 1. For example, FIG. 6 shows high side device 602$a$, high side conductive clip 604$a$, high side power pads $V_{H1}$ and $V_{H2}$, high side gate pad $G_{H1}$, and output current pad $U_{out}$ corresponding respectively to high side device 102$a$, high side conductive clip 104$a$, high side power pads $V_{H1}$ and $V_{H2}$, high side gate pad $G_{H1}$, and output current pad $U_{out}$ in FIG. 1. Power semiconductor package 600 further includes substrate material 606$a$ and 606$b$ (also referred to herein collectively as substrate 606), which correspond collectively to substrate 106 in FIG. 1. In the present embodiment high side power pads $V_{H1}$ and $V_{H2}$, high side gate pad $G_{H1}$, and common output pad $U_{out}$, comprise DBC of substrate 606.

High side power device 602$a$ is a high side power switch of a U phase of power module 622, which is a three-phase inverter module in the present embodiment. High side power device 602a includes diode die 646, which is a freewheeling diode, connected in parallel with IGBT die 644. Gate 656 of IGBT die 644 is electrically connected to gate pad $G_{H1}$ through a bottom surface of IGBT die 644. Conductive clip 604a is connecting collector 648 of high side device 602a to cathode 652 of high side device 602a. In the present embodiment, conductive clip 604a is electrically connected to collector 648 through a top surface of IGBT die 644 and is electrically connected to cathode 652 through a top surface of diode die 646. Common output pad $U_{out}$ is electrically connecting emitter 650 of high side device 602a and anode 654 of high side device 602a. In the present embodiment, common output pad $U_{out}$ is electrically connected to emitter 650 through a bottom surface of IGBT die 644 and is electrically connected to anode 654 through a bottom surface of diode die 646.

Thus, as described above, conductive clip 604a is connecting a collector/cathode node of high side device 602a and common output pad $U_{out}$ is connecting an emitter/anode node of high side device 602a. High side devices 102b and 102c in FIG. 1 as implemented in power semiconductor package 600 have a similar configuration as high side device 602a. Also, low side devices 102d, 102e, and 102f in FIG. 1 as implemented in power semiconductor package 600 have a similar configuration as high side device 602a, but a respective low side conductive clip 104 is connecting a corresponding emitter/anode node of a respective low side device 102 and common output pads $U_{out}$, $V_{out}$, and $W_{out}$ are respectively connecting a corresponding collector/cathode node of the respective low side device 102. Thus, although not shown in FIG. 6, common output pad $U_{out}$ is coupling the emitter/anode node of high side device 602a to a collector/cathode node of a low side device, which can correspond to low side device 102d in FIG. 1.

Conductive clip 604a includes power device top surface 628a and opposing legs 642a and 642b connected to power device top surface 628a. Leg 642a is electrically connecting power device top surface 628a to power pad $V_{H1}$ and leg 642b is electrically connecting power device top surface 628a to power pads $V_{H2}$. As such, current can traverse through conductive clip 604a over output current pad $U_{out}$ and gate pad $G_{H1}$ as indicated by current path 658. Thus, as described above, conductive clip 604a and in particular power device top surface 628a can be part of a high side power bus and can be exposed to significant heat.

In the present embodiment, substrate 606 comprises substrate material 606a over substrate material 606b. Substrate material 606a comprises dielectric material and substrate material 606b comprises conductive material. Thus, bottom surface 616 of power module 622 comprises conductive material. In some embodiments, bottom surface 616 of power module 622 comprises dielectric material. For example, substrate material 606a can be dielectric material on bottom surface 616. Substrate 606 can comprise DBC. For example, substrate material 606a can be ceramic and substrate material 606b can be copper bonded to substrate material 606a. Furthermore, high side power pads $V_{H1}$ and $V_{H2}$, high gate pad $G_{H1}$, and common output pad $U_{out}$ can be copper bonded to substrate material 606a.

Power semiconductor package 600 also includes cap material 640a and 640b (also referred to herein collectively as cap layer 640) over power device 602a. Although not shown in FIG. 1, a respective cap layer similar to cap layer 640 can optionally be over each respective one of power devices 102 in FIG. 1. In other embodiments a single cap layer similar to cap layer 640 can optionally extend over more than one of power devices 102. Also, some embodiments may not include an element similar to cap layer 640.

As shown in FIG. 6, cap layer 640 is over high side device 602a. Cap layer 640 can comprise any suitable substrate material. In the present embodiment, cap material 640a comprises dielectric material and cap material 640b comprises conductive material. Thus, top surface 660 of power module 622 comprises conductive material. In some embodiments, top surface 660 of power module 622 comprises dielectric material. For example cap layer 640 may include cap material 640a on top surface 660. In other embodiments, power module 622 may not include cap layer 640. For example, high side conductive clip 604a can be on top surface 660 of power module 622. Cap layer 640 can comprise DBC. For example, cap material 640a can be ceramic and cap material 640b can be copper bonded to cap material 640a. Furthermore, in some embodiments high side conductive clip 604a can comprise copper bonded to cap material 640a.

Thus, as described above, power module 622 comprises substrate 606 and cap layer 640 in contact with high side device 602a. Furthermore, cap layer 640 is in contact with top side 624 of double-sided heat sink 620 and substrate 606 is in contact with bottom side 626 of double-sided heat sink 620. High side device 602a can be thermally coupled to bottom side 626 of heat sink 620 through substrate 606 and high side device 602a can be thermally coupled to top side 624 of heat sink 620 through cap layer 640. Thus, heat sink 620 can dissipate heat from both power device top surface 628a and power device bottom surface 662. Furthermore, because both power device top surface 628a and power device bottom surface 662 carry current, heat can efficiently be dissipated from high side device 602a. As such, heat sink 620 can be sized with low dependence upon power module 622 allowing for double-sided heat sink 620 to be small if desired while sufficiently cooling high side device 602a.

Thus, as discussed above, in the embodiments of FIGS. 1 through 6, the present invention provides a power semiconductor package with a power module including a plurality of power devices having a corresponding plurality of power device top surfaces. By including a double-sided heat sink with a top side in contact with the plurality of power device top surfaces, various embodiments of the present invention allow for sufficient cooling of the power devices while providing high flexibility in the design of the power semiconductor package to accommodate application specific requirements. For example, the heat sink can be made smaller and be less expensive than conventional heat sinks. Thus, design and manufacturing costs of the power semiconductor package can be substantially reduced.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:
1. A power semiconductor package comprising:
a power module comprising a plurality of power devices;

said plurality of power devices having a corresponding plurality of power device top surfaces;

a double-sided heat sink with a top side in thermal contact with said plurality of power device top surfaces, with a bottom side in contact with a bottom surface of said power module, and with at least one connecting portion joining said top side and said bottom side;

wherein at least one of said plurality of power device top surfaces forms part of a power bus connecting at least two transistors of said plurality of power devices.

2. The power semiconductor package of claim 1 comprising at least one fastening clamp pressing said top side and said bottom side of said double-sided heat sink into said power module.

3. The power semiconductor package of claim 2, wherein said at least one fastening clamp is at least one heat sink screw.

4. The power semiconductor package of claim 1 wherein said top side and said bottom side of said double-sided heat sink are attached to one another by at least one fastening clamp.

5. The power semiconductor package of claim 4 wherein said at least one fastening clamp attaching said top side and said bottom side of said double-sided heat sink to one another is at least one heat sink screw.

6. The power semiconductor package of claim 1 wherein said double-sided heat sink encloses said power module.

7. The power semiconductor package of claim 1 wherein said double-sided heat sink includes a water-cooling element.

8. The power semiconductor package of claim 1 wherein said double-sided heat sink includes a water-cooling element coupling said top side and said bottom side of said double-sided heat sink.

9. The power semiconductor package of claim 1 wherein each of said corresponding plurality of power device top surfaces are configured to carry current.

10. The power semiconductor package of claim 1 wherein each of said corresponding plurality of power device top surfaces comprises a conductive clip configured to carry current.

11. The power semiconductor package of claim 1 wherein said plurality of power device top surfaces comprise copper.

12. The power semiconductor package of claim 1 wherein said bottom surface of said power module is a bottom surface of a substrate of said power module.

13. The power semiconductor package of claim 1 wherein said bottom surface of said power module comprises conductive material.

14. The power semiconductor package of claim 1 wherein said plurality of power devices are on a substrate of said power module, a cap layer being over at least one of said plurality of power devices.

15. The power semiconductor package of claim 14 wherein said substrate and said cap layer each comprise direct bonded copper (DBC).

16. The power semiconductor package of claim 14, wherein said at least one of said plurality of power devices is thermally coupled to said bottom side of said double-sided heat sink through said substrate and is thermally coupled to said top side of said double-sided heat sink through said cap layer.

17. The power semiconductor package of claim 1 comprising a plurality of contacts extending out from said double-sided heat sink to provide connection to said power module.

18. The power semiconductor package of claim 1 wherein each of said plurality of power devices is a power switch.

19. The power semiconductor package of claim 1 wherein each of said plurality of power devices comprises an insulated-gate bipolar transistor (IGBT) in parallel with a diode.

20. The power semiconductor package of claim 1 wherein said power module is a motor drive inverter module.

* * * * *